(12) United States Patent
Daniel et al.

(10) Patent No.: US 7,576,000 B2
(45) Date of Patent: Aug. 18, 2009

(54) MOLDED DIELECTRIC LAYER IN PRINT-PATTERNED ELECTRONIC CIRCUITS

(75) Inventors: Jurgen H. Daniel, San Francisco, CA (US); Ana C. Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 322 days.

(21) Appl. No.: 11/615,229

(22) Filed: Dec. 22, 2006

(65) Prior Publication Data

US 2008/0150187 A1    Jun. 26, 2008

(51) Int. Cl.
*H01L 21/4763* (2006.01)
(52) U.S. Cl. .................. 438/637; 438/780; 438/781; 257/E23.134
(58) Field of Classification Search ......... 438/637–642, 438/780–783; 257/E23.134, E29.165
See application file for complete search history.

(56) References Cited

U.S. PATENT DOCUMENTS

2005/0133788 A1   6/2005   Chabinyc et al.
2005/0142855 A1*  6/2005   Choi .......................... 438/637

* cited by examiner

*Primary Examiner*—H. Jey Tsai
(74) *Attorney, Agent, or Firm*—Marger Johnson & McCollom, P.C.

(57) ABSTRACT

A method forms a first active electronic layer, prints an array of pillars on the first active electronic layer, dispenses a curable polymer over the array of pillars, molds the curable polymer by contacting the curable polymer with a mold structure to displace the curable polymer from upper surfaces of the pillars, cures the curable polymer to produce a hardened polymer, and removes the array of pillars to leave an array of holes in the hardened polymer. Another method provides a substrate having selected areas, prints an array of pillars on the substrate, dispenses a curable polymer over the array of pillars, molds the curable polymer by contacting the array of pillars with a mold structure to displace the curable polymer from upper surfaces of the pillars, cures the curable polymer to produce a hardened polymer, and removes the array of pillars to leave an array of holes in the hardened polymer corresponding to the selected areas. Another method forms a first active electronic layer on a substrate, prints an array of conductive pillars on the active electronic layer on a substrate, dispenses a curable polymer on the array of conductive pillars, molds the curable polymer by contacting the array of pillars with a mold structure to displace the curable polymer from the upper surfaces of the conductive pillars, curing the curable polymer to produce a hardened polymer, and forms a second active electronic layer on the hardened polymer such that the second active electronic layer is in electrical connection with the first active electronic layer through the conductive pillars.

20 Claims, 9 Drawing Sheets

MOLDED DIELECTRIC LAYER IN PRINT-PATTERNED ELECTRONIC CIRCUITS

GOVERNMENT FUNDING

This invention was made with Government support under Cooperative Agreement No. 70NANB3H3029 awarded by the National Institute of Standards and Technology. The Government has certain rights in this invention.

BACKGROUND

It is possible to form electronic circuits using printing technologies, typically ink-jet printing, where the 'ink' is actually liquids that can form the structures. Printed lines and dots used in forming the circuit have relatively large features sizes that are not conducive to some electronic devices.

In one example, assume an active matrix display backplane with high fill-factor pixels. Fill factor is generally a ration of the area of pixel that is actively controlling, or in the case of active-matrix sensor arrays receiving/sensing light, to the area of the entire pixel. Each pixel of a thin-film transistor (TFT) active matrix backplane generally has a switching transistor and a pixel pad for each pixel.

Each transistor typically consists of several layers: a gate layer, a gate dielectric layer, a source/drain layer and a semiconducting layer. In typical pixels with bottom-gate TFTs, the data lines which apply the data signals to the pixels are on the same level as the source/drain layer of the TFT and of the pixel pad. If the data lines are wide, the region of the pixel pad becomes smaller within a given area for a pixel. The area of the pixel is limited because image quality generally comes from a number of pixels per image, and as many pixels as possible are squeezed onto a given backplane.

In an approach to overcome this problem an additional metal layer is introduced which extends or 'mushrooms' the pixel drain pad layer over the transistor circuitry and partially over the data lines. This also shields the TFT channel region from light which is essential for low charge-leakage in the TFT off-state. Vias are formed in a dielectric layer over the transistor to allow connection between this 'mushroom metal' pixel pad and the underlying drain pad which is connected to the drain of the TFT. The example of a display backplane is compelling, but forming of vias for interconnects between layers is also important in other electronic circuits where often multiple dielectric layers separate conducting, semiconducting or otherwise functional layers, referred to here as active electronic layers or active layers. Moreover, forming simple via holes in a dielectric layer is required for other applications such as in microfluidic circuits where the dielectric layer may contain a fluid and sensing elements lie in a layer underneath the dielectric.

However, forming vias in a printing technology can be a problem. Printing technologies tend to be additive, where things are added together to form images, such as in color printing where colors are added together to form a final color. Circuits formed from printing technologies are generally formed by adding layers to other layers to form the structures. In one example, a conventional semiconductor fabrication process deposits a continuous dielectric layer. To form vias, the process must etch the vias into the dielectric. In another example, a micromolding process molds a polymeric dielectric layer with vias in a single step, if alignment is included in the step. However, a thin surface layer typically remains at the bottoms of the vias that has to be removed by etching.

Generally, etching, such as wet-chemical or plasma etching, does not occur in printing technologies. This makes forming the vias problematic, as vias are normally formed by etching.

SUMMARY

An embodiment is a method that forms a first active electronic layer, prints an array of pillars on the first active electronic layer, dispenses a curable polymer over the array of pillars, molds the curable polymer by contacting the curable polymer with a mold structure to displace the curable polymer from upper surfaces of the pillars, cures the curable polymer to produce a hardened polymer, and removes the array of pillars to leave an array of holes in the hardened polymer.

Another embodiment is a method that provides a substrate having selected areas, prints an array of pillars on the substrate, dispenses a curable polymer over the array of pillars, molds the curable polymer by contacting the array of pillars with a mold structure to displace the curable polymer from upper surfaces of the pillars, cures the curable polymer to produce a hardened polymer, and removes the array of pillars to leave an array of holes in the hardened polymer corresponding to the selected areas.

Another embodiment is a method that forms a first active electronic layer on a substrate, prints an array of conductive pillars on the active electronic layer on a substrate, dispenses a curable polymer on the array of conductive pillars, molds the curable polymer by contacting the array of pillars with a mold structure to displace the curable polymer from the upper surfaces of the conductive pillars, curing the curable polymer to produce a hardened polymer, and forms a second active electronic layer on the hardened polymer such that the second active electronic layer is in electrical connection with the first active electronic layer through the conductive pillars.

BRIEF DESCRIPTION OF THE DRAWINGS

Embodiments of the invention may be best understood by reading the disclosure with reference to the drawings, wherein.

DETAILED DESCRIPTION OF THE EMBODIMENTS

Figure 1:
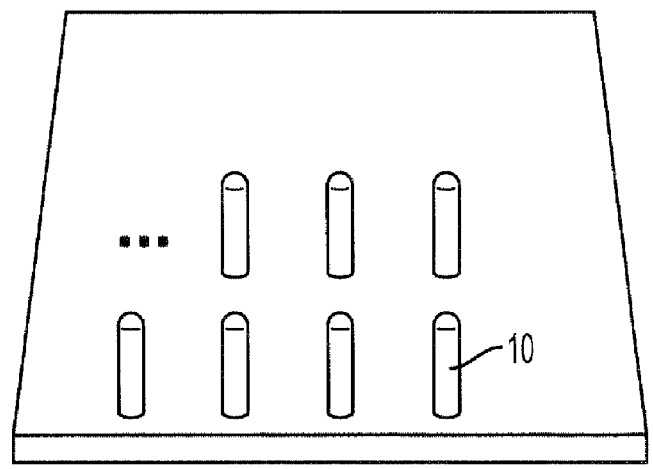
FIG. 1 shows an example of an array of pillars.

FIG. 1 shows an example of sacrificial pillars printed on a substrate. These pillars such as 10 define a via area in which will be formed a via contact. Wax, such as Kemamide-based wax is just one possible material that could be used to form the pillars. Waxes have a low viscosity above their melting point and therefore are suitable for jet-printing. Below their melting point they solidify. Since these materials are printed without solvents, the volume shrinkage is relatively low which enables the printing of rather tall structures. Other materials include solvent-based polymers such as ProLift™ manufactured by Brewer Science or heat decomposable polymers such as the family of Unity™ polymers manufactured by Promerus. Except for the heat decomposable polymer, the materials would be later removed in a solvent that would not attack the subsequently applied dielectric, typically a polymer. ProLift™ is as lift-off polymer which is rather temperature stable and resistant to organic solvents, but it retains solubility in aqueous developers. In the case of the heat decomposable material, the material would be removed at a later stage of the process by heating beyond a decomposition temperature. While much of the discussion here may focus on individual pillars, the pillars may also consist of walls or other geometries such as linear structures, rectangular structures, extended circular structures, etc. that later form reservoirs, channels or regions.

Figure 2:
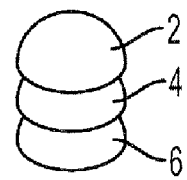
FIG. 2 shows a more detailed view of a pillar.

FIG. 2 shows an example of a pillar structure formed by printing. Ink-jet printing may be one example printing method, but other printing methods may also be chosen, such as dip-pen deposition, flexographic printing, screen printing or other deposition methods that are capable of selectively depositing small quantities of a material. Examples of ink-jet printing include piezo-ink-jet printing, thermal ink-jet printing, electrostatic ink-jet printing, etc. To achieve a vertical extent higher than a single drop of ink-jetted material, the pillars may be formed of a stack of drops of ink. FIG. 2 shows an example of a pillar formed from three drops of the ink, 2, 4 and 6. It must be noted that as the term 'ink' is used here, it includes any liquid dispensed using printing technologies for the formation of electronic circuits and components and microstructures.

Figure 3:
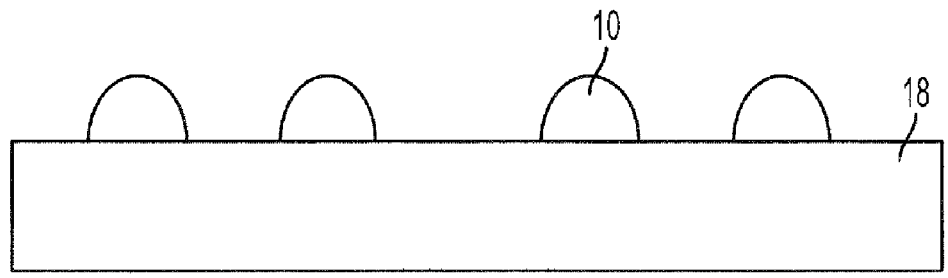
FIGS. 3-8 show an example of a method of forming vias using printing techniques.

FIG. 3 shows the beginning of a process to form vias using printing processes, rather than conventional processes employing etching. A via is a hole or opening in a layer that allows connections between layers above and below the layer in which the via exists. Vias may be left empty to expose a selected area on the underlying substrate, they may be filled or partially filled with metal, either before or after formation and they may be also filled or partially filled with a semiconducting material or other functional material. Examples of the selected areas on the substrate may be areas in which a sensor or other sensitive material resides, or an actuator for which it is desirable to leave the area open to the surrounding environment. Selected areas are defined regions on the substrate for which it is desirable that they be accessible from higher layers. The sensor may be a heat sensor such as a thermistor, it may be a pressure sensor or a flow sensor or a chemical or biosensor such as an ion sensor, pH sensor or surface acoustic wave sensor, for example. As an actuator, a heater may be located on the substrate that heats a fluid above. Alternatively, a membrane actuator or an ultrasonic actuator may be located on the substrate, for example. Vias or holes filled or partially filled or coated with metal or other conductive material may be referred to here as via contacts or conductive paths.

In FIG. 3, a printing process deposits or otherwise forms an array of sacrificial pillars such as 10 on a substrate 18. As discussed above, the printing process may repeat as needed to achieve the proper height for the pillars. In one example the printing process is a jet-printing process and the deposited material is a hot-melt wax.

Figure 4:
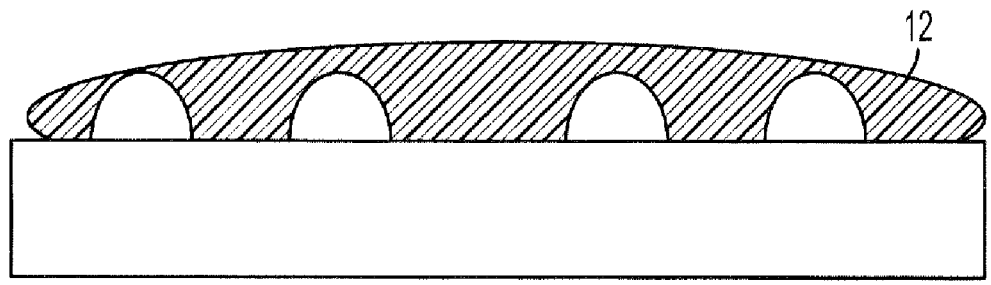

In FIG. 4, a curable polymer 12 covers the pillars. It is dispensed by any known dispensing methods for liquids or flowable substances, including pipette dispensing, syringe dispensing, other pressure driven dispensing methods, including extrusion-type dispensing, but also spray dispensing or simple pouring from a reservoir, etc. A curable polymer is a substance that is a liquid or flowable substance/polymer until it undergoes a curing process that causes it to harden. The polymer material may include organic polymers, inorganic polymers, organic-inorganic hybrids and composites, for example.

The curing process may involve the application of heat or radiation, including UV light. The curing process may also be a catalytic curing process. At the point of the process shown by FIG. 4, the curable polymer remains in its moldable, uncured state. Example polymers are the UV curable polymers Norland optical adhesive 68 or Norland optical adhesive 60 (Norland Products, Inc. Cranbury, N.J.) and the two component epoxy Devcon 5 Minute Epoxy (ITW Performance Polymers, Riviera Beach, Fla.). If the pillar structures are relatively heat resistant, such as for the later mentioned metal pillars, or if the pillars have a relatively high melting/softening point, the curable polymer may also be a thermoplastic polymer. Here 'curing' does not refer to permanent curing, but it would be used in the context of 'hardening' or solidifying by lowering the process temperature. Example polymers would be thermoplastic polymers often used in molding applications such as PMMA (polymethylmethacrylate), PC (polycarbonate), PSU (polysulfone), COC (cyclo-olefine copolymer), PS (polystyrene), etc.

Figure 5:
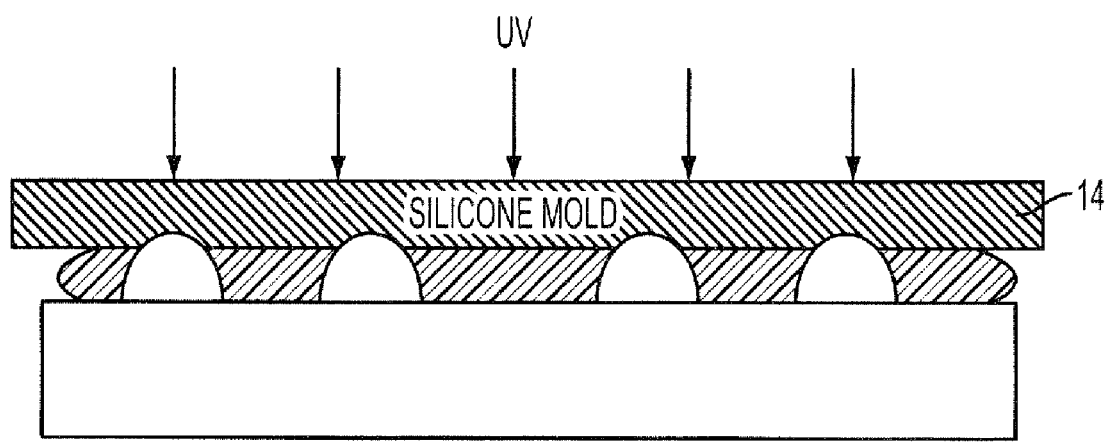

In FIG. 5, the process applies a mold 14 to the uncured polymer. The mold may consist of a silicone elastomer, such as Sylgard 184 silicone manufactured by Dow, Gel-Film® (Gel-Pak) materials, etc. The mold material may be an elastomeric material or it may be a rigid material and it may be coated with a low-surface-energy coating such as a fluorocarbon coating or it may be treated with commonly known mold-release agents. During the molding process, the surface of the mold contacts the top surfaces of the pillars and displaces the curable polymer.

In the case of an elastomeric mold the contact between the pillar top surface and the mold may be increased due to the deformation of the elastomer. For larger arrays of pillars, this can make the displacement of the polymer on all the pillars more reliable. In the case of thermoplastic pillars or wax pillars, one may also heat the substrate at this point to cause the pillars to soften, which in combination with a slight pressure from the mold may result in an improved via profile due to the occurring deformation in the pillars. Softening the pillars may also assist in displacing the curable polymer from the tops of the pillars.

Figure 6:
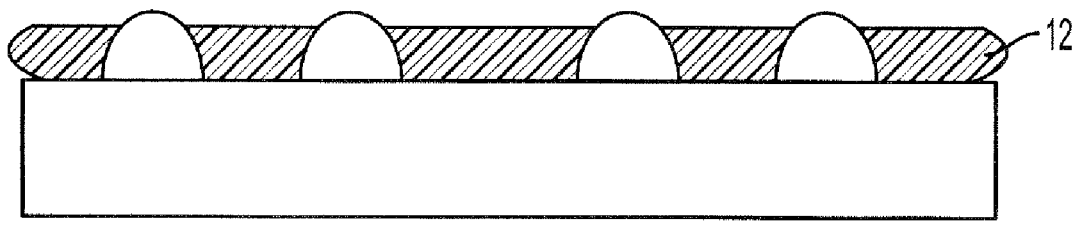

FIG. 5 also shows the application of UV light, assuming that the curable polymer is a UV curable polymer, just one example of many different types of curable polymers suitable for this process. The application of the UV light causes the curable polymer in this example to 'cure' or harden. In another example, UV exposure may not be required and the polymer may cure by catalytic curing such as in a two-component epoxy polymer, for example. The polymer 12 may also contain inorganic particles such as titania or barium titanate nanoparticles if an increased dielectric constant is desired. FIG. 6 shows the resulting structure after removal of the mold. The hardened polymer has formed a layer having the top surfaces of the array of pillars exposed.

It must be noted that using a rigid mold instead of an elastomeric mold, or if the pillars soften after heating, the pillars would not extend from the surface in FIG. 6. The extending pillars shown in FIG. 6 are seen if one uses a soft elastomer mold because it deforms slightly around the pillars.

Figure 7:
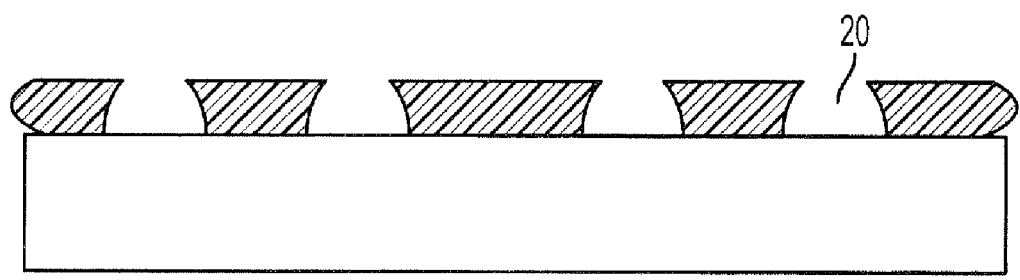

FIG. 7 shows the hardened polymer after removal of the pillars. In the example of a Kemamide-wax pillar, the pillars would dissolve in a warm isopropanol solution. The solvent should not attack the curable polymer, which could be one of the polymers mentioned above. The hardened polymer has an array of holes or openings 20, which may have any shape.

Figure 8:
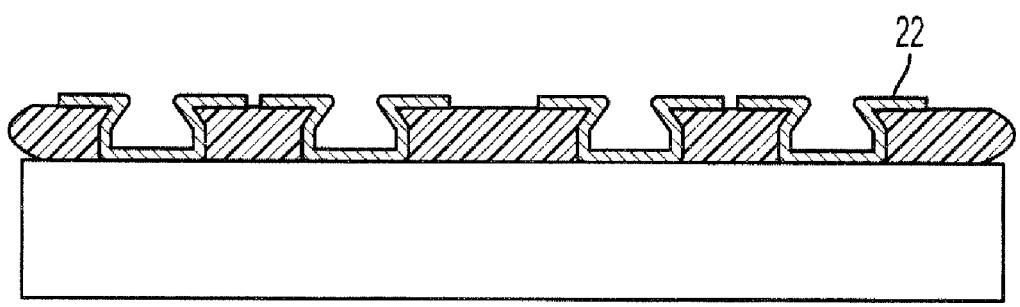

If desired, a conductive layer 22 may form electrical contacts in the openings, between a first functional layer on the substrate and a second functional layer on the polymer layer. FIG. 8 shows an example of a conductive layer. The conductive layer may consist of a patterned metal, a polymeric conductor, a semiconductor or other conducting or semiconducting material. The material maybe deposited for example from a solution by jet-printing or by conventional vacuum deposition methods. In one example, the conducting material is jet-printed silver deposited from a solution of silver nanoparticles. The holes or openings in the polymer resulting from the molding process may have different profiles, depending upon the molding techniques. The openings may tilt, or have an enhanced profile with a decreasing diameter from bottom to top. These alternatives come from variations in the printing process such as altering the diameters of the drops, or moving a second drop slightly to one side of a first drop. The printing process discussed up to now has not mentioned any alignment.

Figure 9:
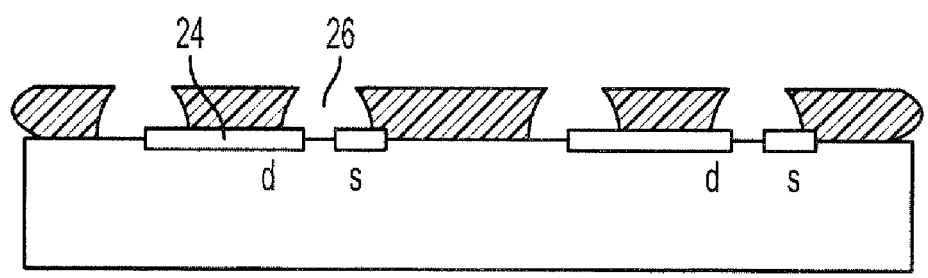
FIGS. 9-11 show an alternative example of a method of forming vias using printing techniques.

FIG. 9 shows an example of a structure having a first functional layer for which the process should include an alignment process. This example has a transistor structure having source 26 and drain 24 contacts on the functional layer on the substrate. The process would form the polymer layer over the source and drain contacts, with the openings aligned to the source and drain contacts. Functional or active layers may include contacts, as in the source and drain contacts, active areas, such as implanted, semiconductive regions, conductive traces, components, etc.

Figure 10:
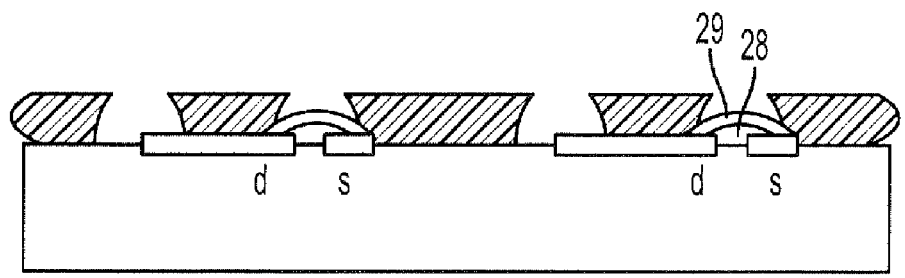

In FIG. 10, the process deposits a semiconductive material 28 into the openings over the source and drain. This material forms the channel of the thin-film transistor structure. In the shown example the semiconductor material is deposited from solution such as by ink-jet printing. Many solution processable semiconductors are available, including polymeric semiconductors and semiconductor precursors. In one example, the semiconductor is solution deposited polythiophene PQT-12(poly[5,5'-bis(3-dodecyl-2-thienyl)-2,2'-bithiophene]). Here, the function of the via is to contain the semiconductor solution and to prevent excessive spreading. The described transistor structure may be a bottom gate transistor in which case the gate electrode lies on the substrate below the source-drain contacts and below a gate dielectric. An insulating layer 29 may be deposited above the semiconductor, which also acts as a barrier layer against moisture and air.

The transistor structure may also be a top-gate transistor in which case the gate is located above the semiconductor within the via. A gate dielectric is deposited above the semiconductor. Deposition may occur by jet-printing of the dielectric material from solution or the semiconductor and dielectric may be deposited from a blended solution of both materials. In the latter process, the dielectric material phase separates on top of the semiconductor during the drying process. In one example, the polythiophene PQT-12 and the polymer PMMA (Poly-methyl-methacrylate) form such a polymer blend that phase separates.

In the case of a top-gate transistor, the structures shown in FIG. 10 may be used as ISFET (ion selective field effect transistor) structures in which a liquid fills the vias which act as a reservoir. The metal gate of a conventional field effect transistor is replaced by a reference electrode located somewhere in the liquid.

Figure 11:
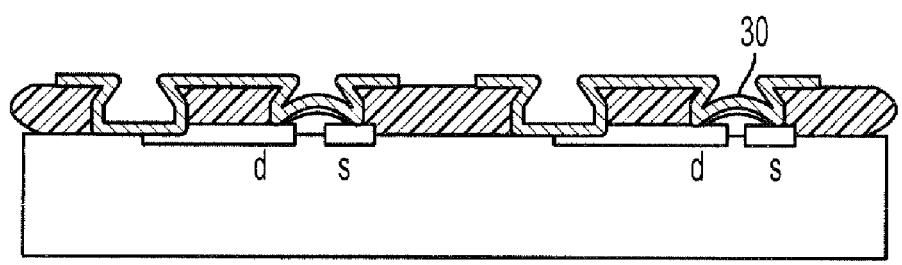

In a conventional top-gate field effect transistor a metal deposited into the via will form the gate. Shown in FIG. 11 is the cross-section of a bottom gate thin-film transistor with 'mushroom-metal' that contacts the drain pad. The conductive layer 30 in FIG. 11 establishes contact to the drain of a transistor and it extends over the transistor area thereby shielding the channel area from ambient light. The dielectric layer above the semiconductor in FIG. 11 is deposited thick enough so that the 'mushroom metal' does not have any gating effect on the transistor channel.

Other layers such as for diode structures may be deposited and patterned onto the conductive layer 30, thus turning the pixels into light sensors. In this manner, an electrical connection forms between the functional layer on the substrate and a subsequent second functional layer, such as a pixel pad in a display or image sensor back plane, through the openings formed from the sacrificial pillars.

Figure 12:
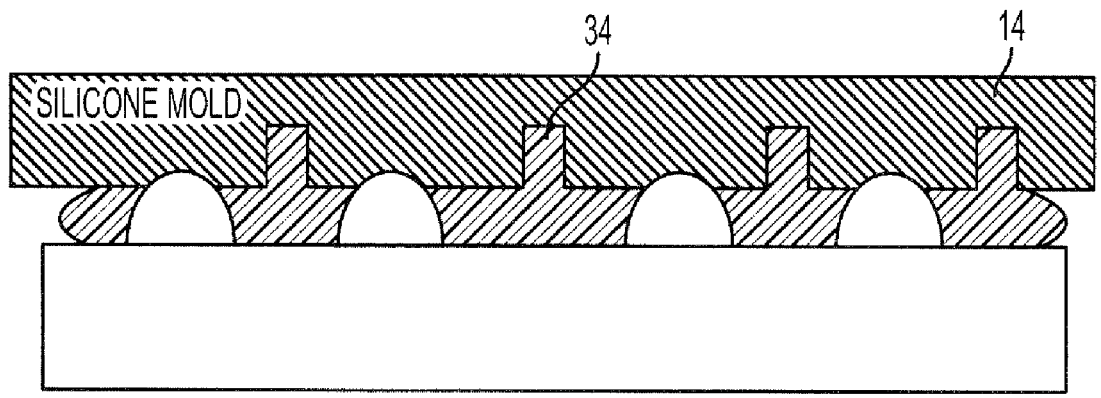
FIGS. 12-15 show an example of a method of forming extended regions of a dielectric layer.
Figure 13:
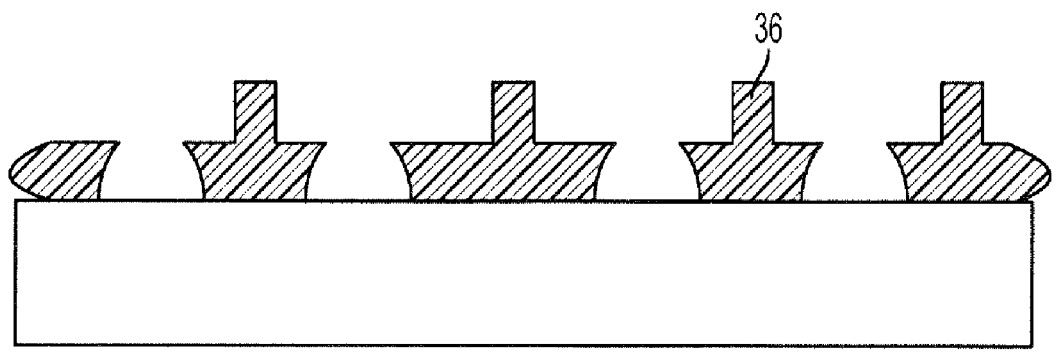

In addition to the openings, the polymer may have formed in it extended regions. Referring to FIG. 12, one can see that the mold 14 differs in its structure now, having relief regions such as 34. When the mold 14 comes into contact with the curable polymer in its soft or liquid state, application of pressure causes the polymer to fill the relief region. After hardening and removal of the sacrificial pillars, the hardened layer has extended regions such as 36, shown in FIG. 13. This structure may provide microfluidic channels, wells or reservoirs with vias to the substrate. The vias may expose sensing circuits, actuators or heaters to manipulate the fluid or to sense properties of the fluid or to detect components of the fluid. As mentioned earlier, the via openings may also be elongated openings, for example patterned along the channel length, so that the fluid inside the channels can be sensed or actuated by circuitry on the substrate all the time during its flow within the channel.

Figure 14:
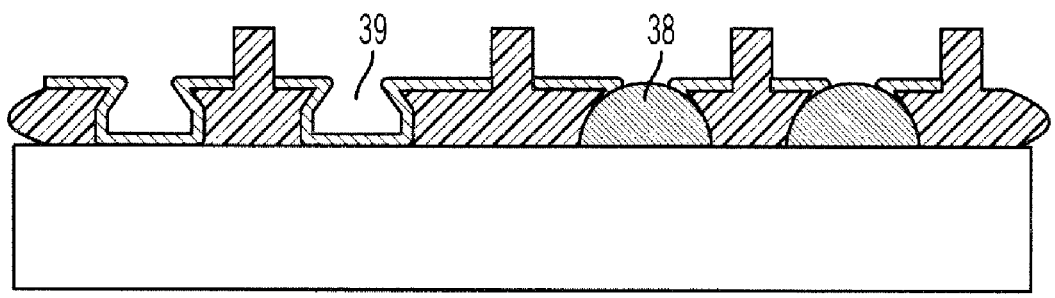

FIG. 14 shows filling of the vias with a conductive material or otherwise functional material, the vias being filled either fully such as 38 or partially, such as 39. Whether a via becomes fully or partially filled depends upon the application for which the structure is intended, as well as the materials and process used. The fully or partially filled vias form conductive paths.

Figure 15:
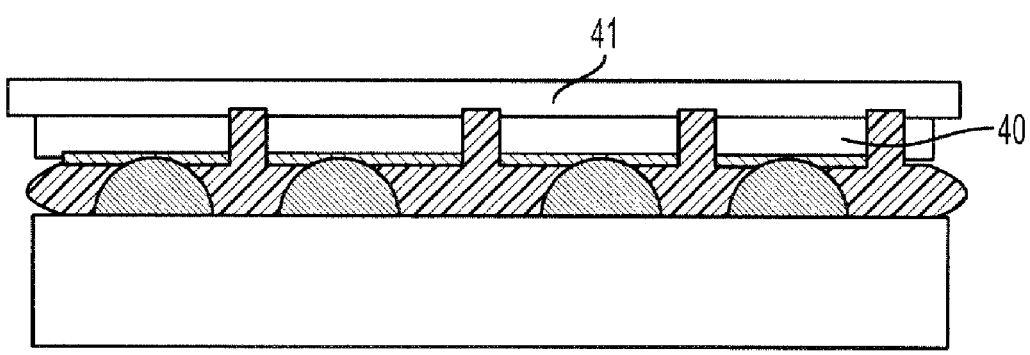

One application of the extended regions includes using the extended regions to form at least one reservoir. As shown in FIG. 15, a reservoir 40 forms between two of the extended regions and the lid 41. The via contacts may provide electrical signals to the region defined by the reservoir to cause a reaction in the material to achieve a particular effect, depending upon the application or electrical signals may be read out through the vias.

These processes would fill the reservoirs with different materials. For example, for sensor applications, a charge generation material may reside in the space between the reservoirs and the lid, charge generation materials may include lead-iodide and mercury-iodide. Typically for display applications, materials in the reservoirs include electrophoretic ink, liquid crystals, electrochromic materials or electrowetting display fluids. The reservoirs may also form liquid or gas microchannels.

Figure 16:
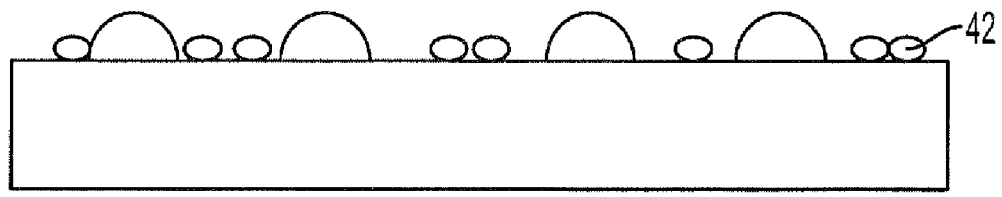
FIGS. 16-20 show examples of alternative methods of forming vias using printing techniques.

Having presented a general discussion of the formation of a molded polymer or molded dielectric layer, various alternatives and modifications become available. For example, FIG. 16 shows several spacer beads such as 42, on the substrate between the sacrificial pillars. Example materials are glass spheres, polystyrene spheres or glass fiber spacers. In one particular example, the spacers are 5 micron fiber spacers from EM Industries of Hawthorne, N.J., and they are typically employed as spacers in the fabrication of liquid crystal displays. The spacer material may be chosen based upon the desired thickness of the dielectric layer. The spacer beads serve to prevent the molding process from compressing the curable polymer excessively and to assure a uniform thickness of the molded dielectric layer over a large area. The spacer beads may be deposited by spraying or by inkjet printing from a dispersion and subsequent drying of the solvent.

Figure 17:
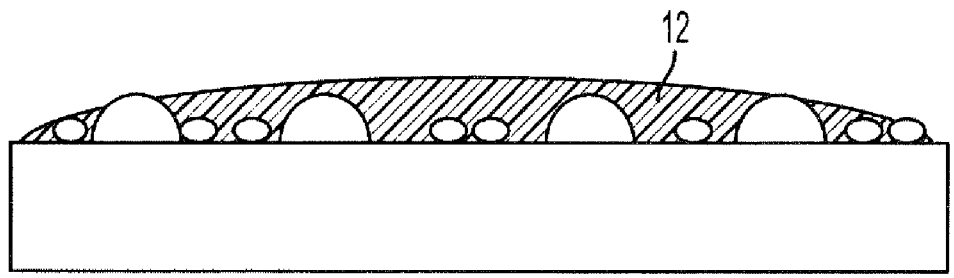
Figure 18:
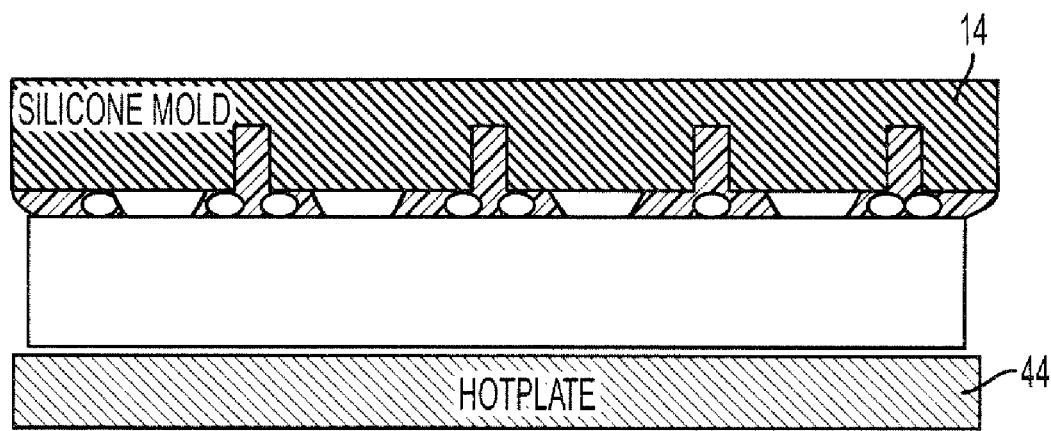

In an alternative process, the curable polymer 12 covers the pillars and the spacer beads, as shown in FIG. 17. Instead of applying the spacer beads first, they may have been dispersed in the polymer. In the molding process of FIG. 18, a mold having relief regions is shown. It must be noted that the mold may or may not have relief regions as used in this process; it is one option to be considered. FIG. 18 shows the option of heating the substrate to soften the thermoplastic polymer pillars prior to compression by the mold 14. For purposes of this discussion, thermoplastic polymer materials includes waxes. The spacer beads ensure that the mold does not compress too much, over-flattening the pillars for any particular application.

Figure 19:
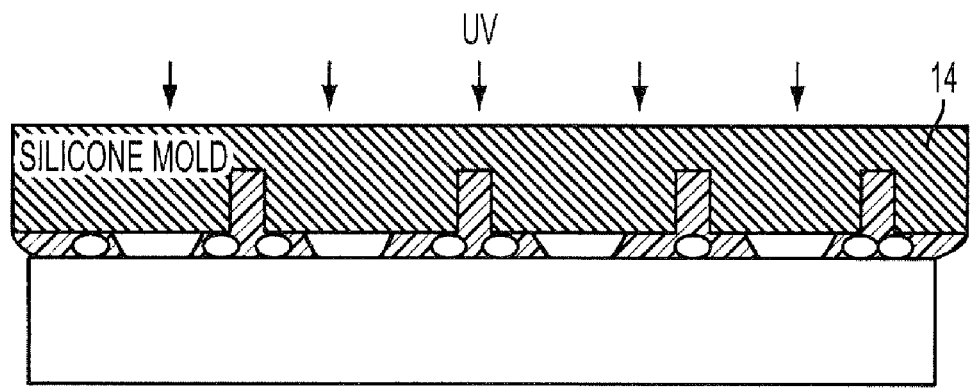
Figure 20:
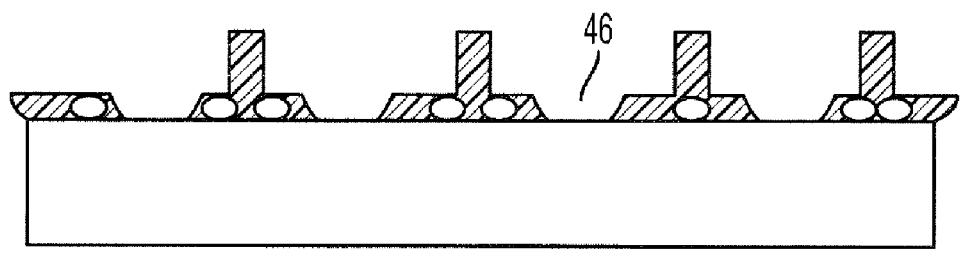

The flattened pillars may result in an improved via profile. The exact via profile also may depend upon the wetting properties of the mold by the wax, if it becomes liquid. Good wetting properties typically result in a small contact angle and a via that is wider towards the top. An example of the resulting via 46 is shown in FIG. 20, after the curing process of FIG. 19. Vias with a greater diameter near the top are advantageous for contact metallization or contact coating.

Figure 21:
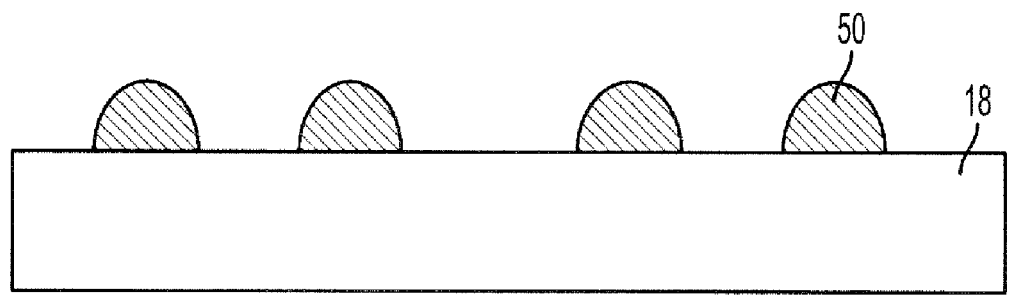
FIGS. 21-27 show an example of a method of forming via contacts using printing techniques.
Figure 22:
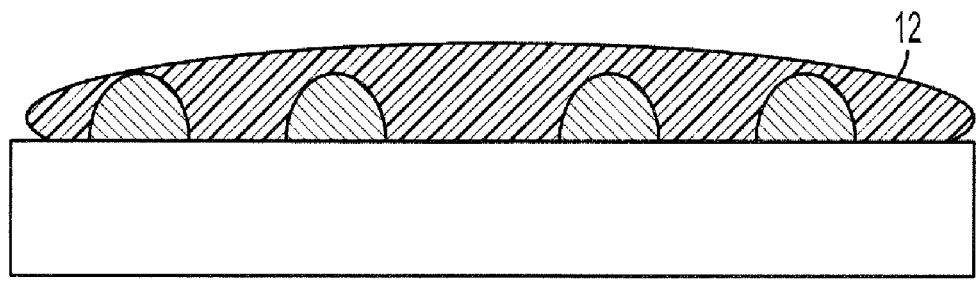
Figure 23:
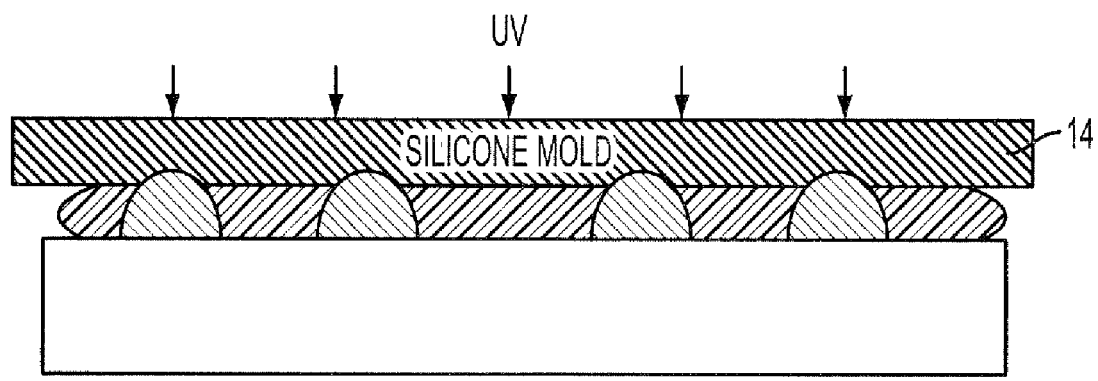
Figure 24:
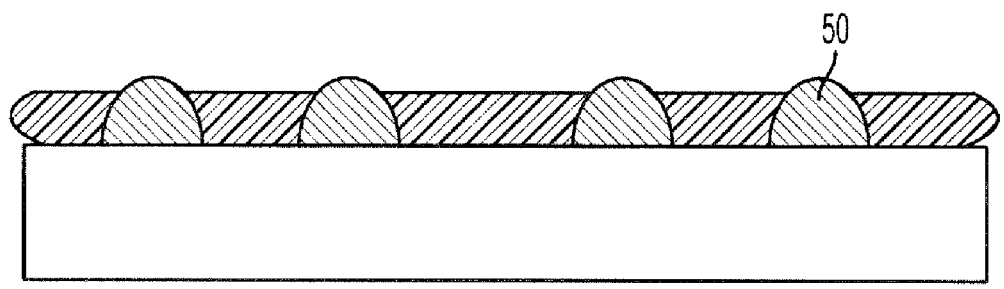

As an alternative to the pillar removal process, a fully additive process may simplify making via contacts between the first and second layers. As shown in FIG. 21, rather than depositing sacrificial pillars, the process deposits metal or conductive pillars such as 50 onto the substrate. The dispensing of the curable polymer 12 in FIG. 22 and the application of the mold 14 of FIG. 23 are similar to those processes already discussed. The resulting polymer layer in FIG. 24 still has openings, but the openings now accommodate the metal pillars 50.

Figure 25:
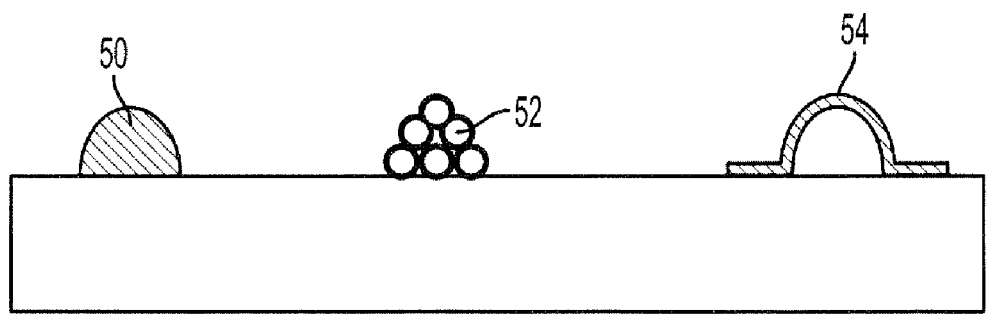

One issue that may arise in formation of the pillars concerns the height of the pillars. Higher pillars may be desired that are not easily formed from repeated jetting of ink drops in a stack. FIG. 25 shows pillar 50 and alternative structures. The metal pillars may include metal particles, such as silver nanoparticles, resulting in a metal pillar 50. To achieve higher pillars, the silver nanoparticles may be mixed with other dispersible larger particles such as styrene particles, glass spheres, etc., shown as 52 in FIG. 25. These particles may have dimensions on the order of micrometers or tens of micrometers and will be referred to here as 'structural particles.' The silver nanoparticles may form a conductive layer around the structural particles. The silver nanoparticles may be first mixed with those structural particles and then the solution is dispensed. Alternatively, the structural particles may be first dispensed and the conductive material is then deposited or printed on top.

Yet another alternative involves depositing a relatively tall polymer bump and then coating the bump with a layer of conductor, as shown by 54. Both the bump and the coating would result from printing processes. The polymer pump may be jet-printed UV-curable polymer and the conductor may be a jet-printed layer of silver nanoparticles or conductive polymer such as PEDOT:PSS (Baytron P).

Figure 26:
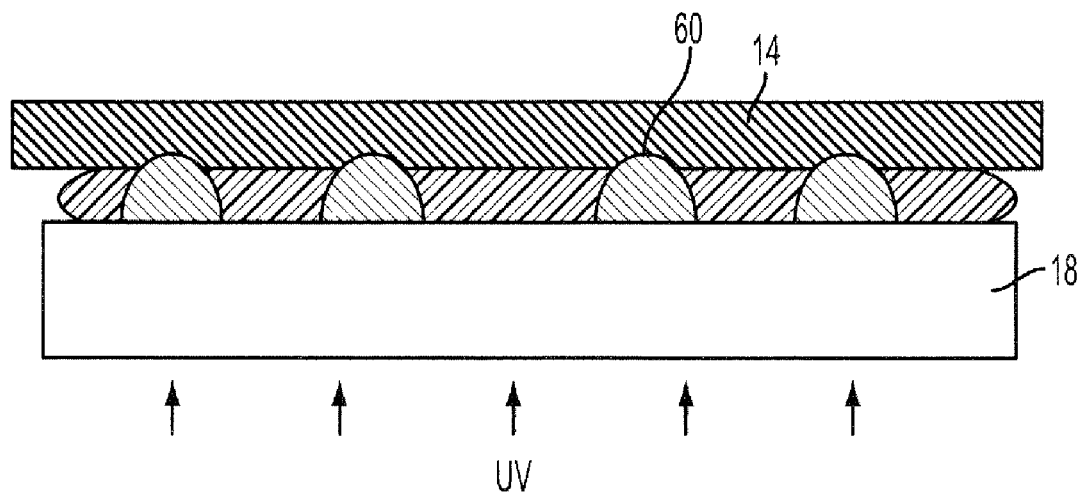
Figure 27:
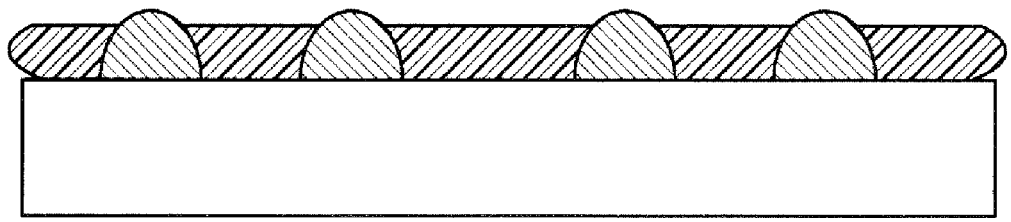

Another possible concern with this process arises with regard to the top surfaces of the pillars. Any residue of the curable polymer on the tops of the pillars may cause problems in the electrical connections. FIGS. 26 and 27 show alternative ways of ensuring that no curable polymer hardens on the top surfaces of the via contacts.

In FIG. 26, the substrate 18 would be substantially transparent, allowing the curing with light to occur through the substrate. Any residual polymer on the top surface 60 of the pillars would not cross-link, and therefore not harden, because the pillars themselves would block the light from reaching that portion of the polymer. This would allow the residue to be removed with solvents.

In FIG. 26, the mold 14 shown in several previous figures could be conductive, such as carbon filled silicone. If the pillars are conductive, one could determine the quality of the electrical contact between the mold and the pillars before curing the polymer by measuring the electrical current flow from the mold 14 to the substrate 18. A capacitive measurement of the capacitance between the mold and the substrate may also be used. Good electrical contact would indicate that little or no residue remains on the tops of the pillars. The resulting structure is shown in FIG. 27.

In this manner, vias allow electrical connections to be made between a first printed circuit and a second printed circuit, or to expose areas of the first printed circuit. These vias are formed in an additive process, rather than involving etching or removal processes.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method, comprising:
   forming a first active electronic layer having selected areas on a substrate;
   printing an array of pillars in the selected areas on the first active electronic layer;
   dispensing a curable polymer over the array of pillars;
   molding the curable polymer by contacting the curable polymer with a mold structure to displace the curable polymer from upper surfaces of the pillars;
   curing the curable polymer to produce a hardened polymer; and
   removing the array of pillars to leave an array of holes in the hardened polymer.

2. The method of claim 1, comprising depositing a conductive material into the array of holes to produce electrically conductive paths.

3. The method of claim 1, wherein printing comprises ink jet printing.

4. The method of claim 1, wherein forming a first active electronic layer further comprises forming source and drain contacts for a transistor structure.

5. The method of claim 4, wherein the array of pillars are aligned over the source and drain contact to result in holes being formed over the source and drain contacts.

6. The method of claim 5, comprising depositing a semiconductive material into the holes to form a channel region of the transistor structure.

7. The method of claim 6, comprising depositing an insulating layer over the channel region.

8. The method of claim 6, comprising forming a metal layer on the hardened polymer such that portions of the metal layer cover the channel region.

9. The method of claim 1, wherein forming an array of pillars comprises forming an array of pillars from one of a wax, a heat decomposable polymer or a lift-off material.

10. The method of claim 1, wherein:
  molding the curable polymer comprises applying a mold having relief regions that become at least partially filled with the curable polymer; and
  curing the curable polymer to form a hardened polymer with extended regions corresponding to the relief regions on the mold, the extended regions forming at least one reservoir.

11. The method of claim 10, comprising filling at least some of the holes with conductive material.

12. The method of claim 11, comprising:
  filling the reservoir with a material; and
  placing a lid over the reservoir that contacts top surfaces of the extended regions to enclose the material.

13. The method of claim 12, wherein the material comprises one of a charge generation material, lead-iodide, mercury-iodide, electrophoretic ink, liquid crystal, electrochromic material, liquid or gas.

14. The method of claim 1, wherein removing the array of pillars comprises one of dissolving the array of pillars or heating the pillars to decompose the pillar material.

15. The method of claim 1, wherein:
  dispensing a curable polymer comprises dispensing a curable polymer having spacer material; and
  molding the curable polymer comprises heating the curable polymer and then using pressure to compress the pillars and the curable polymer.

16. The method of claim 1, comprising forming a second active layer on the hardened polymer such that the array of holes form via connections between the first active layer and the second active layer.

17. A method, comprising:
  providing a substrate having selected areas;
  printing an array of pillars on the substrate;
  dispensing a curable polymer over the array of pillars;
  molding the curable polymer by contacting the array of pillars with a mold structure to displace the curable polymer from upper surfaces of the pillars;
  curing the curable polymer to produce a hardened polymer; and
  removing the array of pillars to leave an array of holes in the hardened polymer corresponding to the selected areas.

18. The method of claim 17, wherein providing a substrate having selected areas comprises providing one of sensors, actuators or heaters on the substrate in the selected areas.

19. The method of claim 17, comprising filling the array of holes with a fluid.

20. The method of claim 17, wherein filling the array holes further comprises inserting electrodes into the holes, the electrodes forming a gate electrode of an ion selective field effect transistor.

* * * * *